(12) United States Patent
Zwier et al.

(10) Patent No.: US 12,276,921 B2
(45) Date of Patent: Apr. 15, 2025

(54) SUBSTRATE COMPRISING A TARGET ARRANGEMENT, AND ASSOCIATED AT LEAST ONE PATTERNING DEVICE, LITHOGRAPHIC METHOD AND METROLOGY METHOD

(71) Applicant: ASML Netherlands B.V., Veldhoven (NL)

(72) Inventors: Olger Victor Zwier, Eindhoven (NL); Maurits Van Der Schaar, Eindhoven (NL); Hilko Dirk Bos, Utrecht (NL); Hans Van Der Laan, Veldhoven (NL); S. M. Masudur Rahman Al Arif, Veldhoven (NL); Henricus Wilhelmus Maria Van Buel, 's-Hertogenbosch (NL); Armand Eugene Albert Koolen, Nuth (NL); Victor Emanuel Calado, Rotterdam (NL); Kaustuve Bhattacharyya, Veldhoven (NL); Jin Lian, Veldhoven (NL); Sebastianus Adrianus Goorden, Eindhoven (NL); Hui Quan Lim, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 17/923,913

(22) PCT Filed: Apr. 21, 2021

(86) PCT No.: PCT/EP2021/060403
§ 371 (c)(1),
(2) Date: Nov. 8, 2022

(87) PCT Pub. No.: WO2021/224009
PCT Pub. Date: Nov. 11, 2021

(65) Prior Publication Data
US 2023/0176491 A1    Jun. 8, 2023

(30) Foreign Application Priority Data

May 7, 2020   (EP) .................................... 20173476
Jun. 25, 2020  (EP) .................................... 20182160

(51) Int. Cl.
*G03F 7/00* (2006.01)

(52) U.S. Cl.
CPC ...... *G03F 7/70641* (2013.01); *G03F 7/70558* (2013.01); *G03F 7/70625* (2013.01); *G03F 7/70633* (2013.01)

(58) Field of Classification Search
CPC .......... G01N 21/4788; G01N 21/9501; G01N 21/956; H01L 22/34; G03F 1/42;
(Continued)

(56) References Cited

U.S. PATENT DOCUMENTS 7,046,361 B1    5/2006  Yang et al.
7,605,907 B2   10/2009  Cramer et al.
(Continued)

FOREIGN PATENT DOCUMENTS

EP    3 499 312 A1    6/2019
EP    3 611 567 A2    2/2020
(Continued)

OTHER PUBLICATIONS

International Search Report and Written Opinion of the International Searching Authority directed to International Patent Application No. PCT/EP2021/060403, mailed Jul. 28, 2021; 9 pages.
(Continued)

*Primary Examiner* — Deoram Persaud
(74) *Attorney, Agent, or Firm* — Sterne, Kessler, Goldstein & Fox P.L.L.C.

(57)    ABSTRACT

Disclosed is a substrate and associated patterning device. The substrate comprises at least one target arrangement
(Continued)

suitable for metrology of a lithographic process, the target arrangement comprising at least one pair of similar target regions which are arranged such that the target arrangement is, or at least the target regions for measurement in a single direction together are, centrosymmetric. A metrology method is also disclosed for measuring the substrate. A metrology method is also disclosed comprising which comprises measuring such a target arrangement and determining a value for a parameter of interest from the scattered radiation, while correcting for distortion of the metrology apparatus used.

17 Claims, 4 Drawing Sheets (58) Field of Classification Search
CPC .............. G03F 7/70558; G03F 7/70625; G03F 7/70633; G03F 7/70641; G03F 7/70683; G03F 9/7026; G03F 9/7076
See application file for complete search history.

(56) References Cited

U.S. PATENT DOCUMENTS

| | | | |
|---|---|---|---|
| 9,927,718 B2 | 3/2018 | Kandel et al. | |
| 11,822,254 B2* | 11/2023 | Den Boef | G01N 21/47 |
| 2007/0229829 A1* | 10/2007 | Kandel | G03F 7/70633 |
| | | | 356/401 |
| 2008/0212097 A1* | 9/2008 | Mos | G03F 7/70633 |
| | | | 356/400 |
| 2010/0201963 A1 | 8/2010 | Cramer et al. | |
| 2011/0027704 A1 | 2/2011 | Cramer et al. | |
| 2011/0043791 A1 | 2/2011 | Smilde et al. | |
| 2011/0102753 A1 | 5/2011 | Van De Kerkhof et al. | |
| 2012/0044470 A1* | 2/2012 | Smilde | G03F 7/70633 |
| | | | 355/72 |
| 2012/0242970 A1 | 9/2012 | Smilde et al. | |
| 2013/0050501 A1 | 2/2013 | Warnaar et al. | |
| 2013/0100427 A1 | 4/2013 | Koolen et al. | |
| 2015/0138523 A1* | 5/2015 | Jak | G03F 7/70625 |
| | | | 355/72 |
| 2016/0061589 A1* | 3/2016 | Bhattacharyya | G01B 11/14 |
| | | | 356/620 |
| 2017/0176871 A1* | 6/2017 | Van Buel | G01N 21/956 |
| 2018/0321599 A1 | 11/2018 | Bozkurt et al. | |
| 2020/0019066 A1* | 1/2020 | Miyaharu | G03F 7/70775 |
| 2020/0110342 A1* | 4/2020 | Zhou | G03F 7/70683 |
| 2023/0207482 A1* | 6/2023 | Li | G03F 7/70683 |
| | | | 257/329 |

FOREIGN PATENT DOCUMENTS

| | | |
|---|---|---|
| TW | 2008-47186 A | 12/2008 |
| TW | 2012-20447 A | 5/2012 |
| WO | WO 2009/078708 A1 | 6/2009 |
| WO | WO 2009/106279 A1 | 9/2009 |
| WO | WO 2012/018673 A2 | 2/2012 |
| WO | WO 2013/178422 A1 | 12/2013 |
| WO | WO 2016/030255 A2 | 3/2016 |
| WO | WO 2020/074412 A1 | 4/2020 |

OTHER PUBLICATIONS

International Preliminary Report on Patentability directed to International Patent Application No. PCT/EP2021/060403, issued Nov. 8, 2022; 6 pages.

Chinese Office Action directed to Chinese Patent Application No. 202180033275.3, mailed Jan. 14, 2025; 14 pages.

* cited by examiner

Fig. 8B # SUBSTRATE COMPRISING A TARGET ARRANGEMENT, AND ASSOCIATED AT LEAST ONE PATTERNING DEVICE, LITHOGRAPHIC METHOD AND METROLOGY METHOD

CROSS-REFERENCE TO RELATED APPLICATIONS

This application claims priority of EP application 20173476.1 which was filed on 7 May 2020 and EP application 20182160.0 which was filed on 25 Jun. 2020, and which are incorporated herein in its entirety by reference.

FIELD OF INVENTION

The present invention relates to a target arrangement for metrology of a lithographic process and to a method to measure a parameter of a lithographic process.

BACKGROUND ART

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. In lithographic processes, it is desirable frequently to make measurements of the structures created, e.g., for process control and verification. Various tools for making such measurements are known, including scanning electron microscopes, which are often used to measure critical dimension (CD), and specialized tools to measure overlay, a measure of the accuracy of alignment of two layers in a device. Overlay may be described in terms of the degree of misalignment between the two layers, for example reference to a measured overlay of 1 nm may describe a situation where two layers are misaligned by 1 nm.

Recently, various forms of scatterometers have been developed for use in the lithographic field. These devices direct a beam of radiation onto a target and measure one or more properties of the scattered radiation—e.g., intensity at a single angle of reflection as a function of wavelength; intensity at one or more wavelengths as a function of reflected angle; or polarization as a function of reflected angle—to obtain a "spectrum" from which a property of interest of the target can be determined. Determination of the property of interest may be performed by various techniques: e.g., reconstruction of the target by iterative approaches such as rigorous coupled wave analysis or finite element methods; library searches; and principal component analysis.

The targets used by conventional scatterometers are relatively large, e.g., 40 μm by 40 μm, gratings and the measurement beam generates a spot that is smaller than the grating (i.e., the grating is underfilled). This simplifies mathematical reconstruction of the target as it can be regarded as infinite. However, in order to reduce the size of the targets, e.g., to 10 μm by 10 μm or less, e.g., so they can be positioned in amongst product features, rather than in the scribe lane, metrology has been proposed in which the grating is made smaller than the measurement spot (i.e., the grating is overfilled). Typically such targets are measured using dark field scatterometry in which the zeroth order of diffraction (corresponding to a specular reflection) is blocked, and only higher orders processed. Examples of dark field metrology can be found in international patent applications WO 2009/078708 and WO 2009/106279 which documents are hereby incorporated by reference in their entirety. Further developments of the technique have been described in patent publications US20110027704A, US20110043791A and US20120242970A. Modifications of the apparatus to improve throughput are described in US2010201963A1 and US2011102753A1. The contents of all these applications are also incorporated herein by reference. Diffraction-based overlay using dark-field detection of the diffraction orders enables overlay measurements on smaller targets. These targets can be smaller than the illumination spot and may be surrounded by product structures on a wafer. Targets can comprise multiple gratings which can be measured in one image.

In the known metrology technique, overlay measurement results are obtained by measuring an overlay target twice under certain conditions, while either rotating the overlay target or changing the illumination mode or imaging mode to obtain separately the $-1^{st}$ and the $+1^{st}$ diffraction order intensities. The intensity asymmetry, a comparison of these diffraction order intensities, for a given overlay target provides a measurement of asymmetry in the target. This asymmetry in the overlay target can be used as an indicator of overlay (undesired misalignment of two layers).

The known methods the metrology measurements may be adversely affected by the metrology apparatus, for example the imperfection of the optical column may induce distortions in the image formed, distortions which may affect adversely the resulting metrology.

SUMMARY OF THE INVENTION

It would be desirable to be able to perform metrology of a lithographic process with increased accuracy.

The invention in a first aspect provides a substrate comprising at least one target arrangement suitable for metrology of a lithographic process, the target arrangement comprising at least one pair of similar target regions which are arranged such that the target arrangement is, or at least the target regions for measurement in a single direction together are, centrosymmetric.

The invention in a second aspect provides at least one patterning device comprising one or more target features configured for patterning a beam to form at least one target arrangement suitable for metrology of a lithographic process, the target arrangement comprising at least one pair of similar target regions which are arranged such that the target arrangement is, or at least the target regions for measurement in a single direction together are, centrosymmetric.

The invention in a third aspect provides a lithographic method comprising: obtaining at least one patterning device comprising one or more target features configured for patterning a beam to form at least one target arrangement suitable for metrology of a lithographic process, the target arrangement comprising at least one pair of similar target regions which are arranged such that the target arrangement is, or at least the target regions for measurement in a single direction together are, centrosymmetric; and forming at least one target arrangement on a substrate using said at least one patterning device.

The invention in a fourth aspect provides a metrology method comprising: a) obtaining a substrate comprising at least one target arrangement suitable for metrology of a lithographic process, the target arrangement comprising at least one pair of similar target regions which are arranged such that the target arrangement is, or at least the target regions for measurement in a single direction together are, centrosymmetric; b) illuminating the target arrangement with measurement illumination and capturing the resultant scattering radiation from the target arrangement; and c) determining a value for a parameter of interest from the scattered radiation, while correcting for distortion of the metrology apparatus used to perform at least step b).

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example only, with reference to the accompanying drawings in which.

DETAILED DESCRIPTION OF EXEMPLARY EMBODIMENTS

Before describing embodiments of the invention in detail, it is instructive to present an example environment in which embodiments of the present invention may be implemented.

Figure 1:
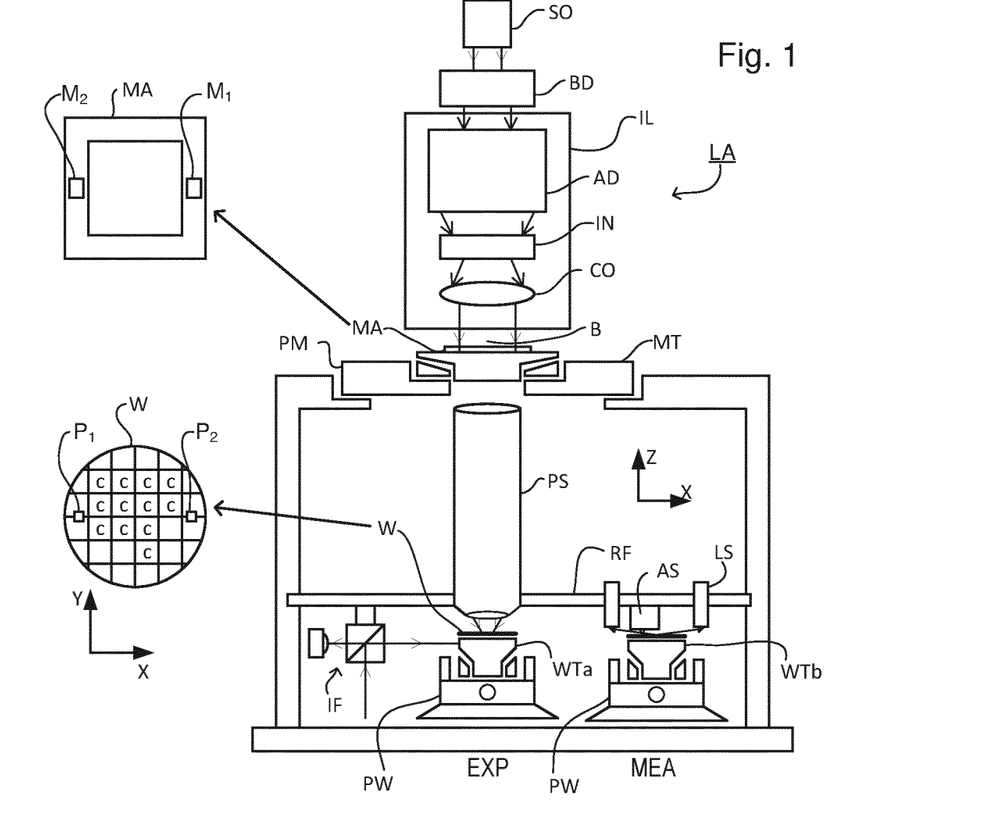
FIG. 1 depicts a lithographic apparatus according to an embodiment of the invention.

FIG. 1 schematically depicts a lithographic apparatus LA. The apparatus includes an illumination optical system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; a substrate table (e.g., a wafer table) WT constructed to hold a substrate (e.g., a resist coated wafer) W and connected to a second positioner PW configured to accurately position the substrate in accordance with certain parameters; and a projection optical system (e.g., a refractive projection lens system) PS configured to project a pattern imparted to the radiation beam B by patterning device MA onto a target portion C (e.g., including one or more dies) of the substrate W.

The illumination optical system may include various types of optical or non-optical components, such as refractive, reflective, magnetic, electromagnetic, electrostatic or other types of components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as G-outer and G-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross section.

The radiation beam B is incident on the patterning device (e.g., mask) MA, which is held on the patterning device support (e.g., mask table MT), and is patterned by the patterning device. Having traversed the patterning device (e.g., mask) MA, the radiation beam B passes through the projection optical system PS, which focuses the beam onto a target portion C of the substrate W, thereby projecting an image of the pattern on the target portion C. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan.

Patterning device (e.g., mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks) Similarly, in situations in which more than one die is provided on the patterning device (e.g., mask) MA, the mask alignment marks may be located between the dies. Small alignment markers may also be included within dies, in amongst the device features, in which case it is desirable that the markers be as small as possible and not require any different imaging or process conditions than adjacent features. The alignment system, which detects the alignment markers is described further below.

Lithographic apparatus LA in this example is of a so-called dual stage type which has two substrate tables WTa, WTb and two stations—an exposure station and a measurement station—between which the substrate tables can be exchanged. While one substrate on one substrate table is being exposed at the exposure station, another substrate can be loaded onto the other substrate table at the measurement station and various preparatory steps carried out. The preparatory steps may include mapping the surface control of the substrate using a level sensor LS and measuring the position of alignment markers on the substrate using an alignment sensor AS. This enables a substantial increase in the throughput of the apparatus.

The depicted apparatus can be used in a variety of modes, including for example a step mode or a scan mode. The construction and operation of lithographic apparatus is well known to those skilled in the art and need not be described further for an understanding of the present invention.

Figure 2:
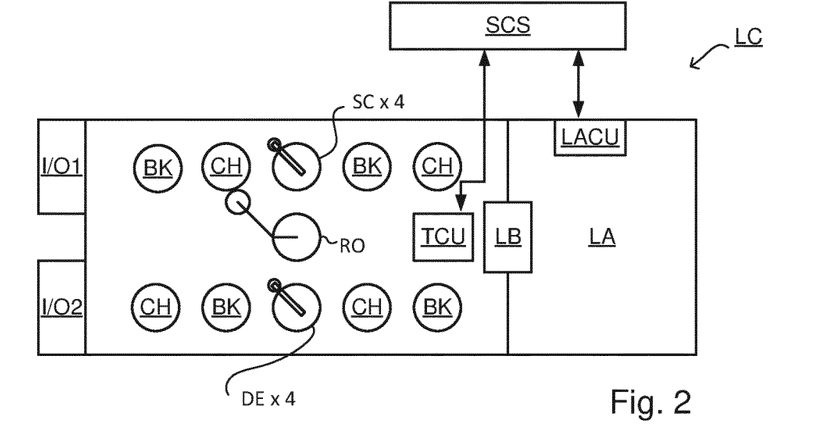
FIG. 2 depicts a lithographic cell or cluster according to an embodiment of the invention.

As shown in FIG. 2, the lithographic apparatus LA forms part of a lithographic system, referred to as a lithographic cell LC or a lithocell or cluster. The lithographic cell LC may also include apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. Accordingly a manufacturing facility in which lithocell LC is located also includes metrology system MET which receives some or all of the substrates W that have been processed in the lithocell. Metrology results are provided directly or indirectly to the supervisory control system SCS. If errors are detected, adjustments may be made to exposures of subsequent substrates, especially if the inspection can be done soon and fast enough that other substrates of the same batch are still to be exposed. Also, already exposed substrates may be stripped and reworked to improve yield, or discarded, thereby avoiding performing further processing on substrates that are known to be faulty. In a case where only some target portions of a substrate are faulty, further exposures can be performed only on those target portions which are good.

Within metrology system MET, an inspection apparatus is used to determine the properties of the substrates, and in particular, how the properties of different substrates or different layers of the same substrate vary from layer to layer. The inspection apparatus may be integrated into the lithographic apparatus LA or the lithocell LC or may be a stand-alone device. To enable most rapid measurements, it is desirable that the inspection apparatus measure properties in the exposed resist layer immediately after the exposure. However, the latent image in the resist has a very low contrast—there is only a very small difference in refractive index between the parts of the resist which have been exposed to radiation and those which have not—and not all inspection apparatuses have sufficient sensitivity to make useful measurements of the latent image. Therefore measurements may be taken after the post-exposure bake step (PEB) which is customarily the first step carried out on exposed substrates and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibilities for rework of faulty substrates but may still provide useful information.

Figure 3A:
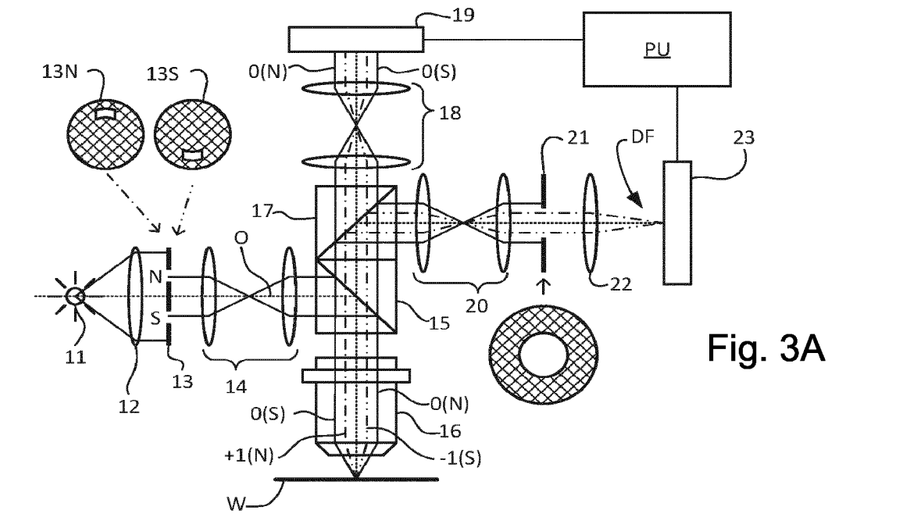
FIG. 3A-FIG. 3D comprise FIG. 3A a schematic diagram of a dark field scatterometer for use in measuring targets using a first pair of illumination apertures, FIG. 3B a detail of diffraction spectrum of a target grating for a given direction of illumination FIG. 3C a second pair of illumination apertures providing further illumination modes in using the scatterometer for diffraction based overlay measurements and FIG. 3D a third pair of illumination apertures combining the first and second pair of apertures.

A metrology apparatus is shown in FIG. 3(a). A target T and diffracted rays of measurement radiation used to illuminate the target are illustrated in more detail in FIG. 3(b). The metrology apparatus illustrated is of a type known as a dark field metrology apparatus. The metrology apparatus depicted here is purely exemplary, to provide an explanation of dark field metrology. The metrology apparatus may be a stand-alone device or incorporated in either the lithographic apparatus LA, e.g., at the measurement station, or the lithographic cell LC. An optical axis, which has several branches throughout the apparatus, is represented by a dotted line O. In this apparatus, light emitted by source 11 (e.g., a xenon lamp) is directed onto substrate W via a beam splitter 15 by an optical system comprising lenses 12, 14 and objective lens 16. These lenses are arranged in a double sequence of a 4F arrangement. A different lens arrangement can be used, provided that it still provides a substrate image onto a detector, and simultaneously allows for access of an intermediate pupil-plane for spatial-frequency filtering. Therefore, the angular range at which the radiation is incident on the substrate can be selected by defining a spatial intensity distribution in a plane that presents the spatial spectrum of the substrate plane, here referred to as a (conjugate) pupil plane. In particular, this can be done by inserting an aperture plate 13 of suitable form between lenses 12 and 14, in a plane which is a back-projected image of the objective lens pupil plane. In the example illustrated, aperture plate 13 has different forms, labeled 13N and 13S, allowing different illumination modes to be selected. The illumination system in the present examples forms an off-axis illumination mode. In the first illumination mode, aperture plate 13N provides off-axis from a direction designated, for the sake of description only, as 'north'. In a second illumination mode, aperture plate 13S is used to provide similar illumination, but from an opposite direction, labeled 'south'. Other modes of illumination are possible by using different apertures. The rest of the pupil plane is desirably dark as any unnecessary light outside the desired illumination mode will interfere with the desired measurement signals.

Figure 3B:
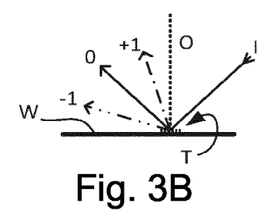

As shown in FIG. 3(b), target T is placed with substrate W normal to the optical axis O of objective lens 16. The substrate W may be supported by a support (not shown). A ray of measurement radiation I impinging on target T from an angle off the axis O gives rise to a zeroth order ray (solid line 0) and two first order rays (dot-chain line +1 and double dot-chain line −1). It should be remembered that with an overfilled small target, these rays are just one of many parallel rays covering the area of the substrate including metrology target T and other features. Since the aperture in plate 13 has a finite width (necessary to admit a useful quantity of light, the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown. Note that the grating pitches of the targets and the illumination angles can be designed or adjusted so that the first order rays entering the objective lens are closely aligned with the central optical axis. The rays illustrated in FIGS. 3(a) and 3(b) are shown somewhat off axis, purely to enable them to be more easily distinguished in the diagram.

At least the 0 and +1 orders diffracted by the target T on substrate W are collected by objective lens 16 and directed back through beam splitter 15. Returning to FIG. 3(a), both the first and second illumination modes are illustrated, by designating diametrically opposite apertures labeled as north (N) and south (S). When the incident ray I of measurement radiation is from the north side of the optical axis, that is when the first illumination mode is applied using aperture plate 13N, the +1 diffracted rays, which are labeled +1(N), enter the objective lens 16. In contrast, when the second illumination mode is applied using aperture plate 13S the −1 diffracted rays (labeled −1(S)) are the ones which enter the lens 16.

A second beam splitter 17 divides the diffracted beams into two measurement branches. In a first measurement branch, optical system 18 forms a diffraction spectrum (pupil plane image) of the target on first sensor 19 (e.g. a CCD or CMOS sensor) using the zeroth and first order diffractive beams. Each diffraction order hits a different point on the sensor, so that image processing can compare and contrast orders. The pupil plane image captured by sensor 19 can be used for focusing the metrology apparatus and/or normalizing intensity measurements of the first order beam. The pupil plane image can also be used for many measurement purposes such as reconstruction.

In the second measurement branch, optical system 20, 22 forms an image of the target T on sensor 23 (e.g. a CCD or CMOS sensor). In the second measurement branch, an aperture stop 21 is provided in a plane that is conjugate to the pupil-plane. Aperture stop 21 functions to block the zeroth order diffracted beam so that the image of the target formed on sensor 23 is formed only from the −1 or +1 first order beam. The images captured by sensors 19 and 23 are output to processor PU which processes the image, the function of which will depend on the particular type of measurements being performed. Note that the term 'image' is used here in a broad sense. An image of the grating lines as such will not be formed, if only one of the −1 and +1 orders is present.

The particular forms of aperture plate 13 and field stop 21 shown in FIG. 3 are purely examples. In another embodiment of the invention, on-axis illumination of the targets is used and an aperture stop with an off-axis aperture is used to pass substantially only one first order of diffracted light to the sensor. In other examples, a two quadrant aperture may be used. This may enable simultaneous detection of plus and minus orders, as described in US2010201963A1, mentioned above. Embodiments with optical wedges (segmented prisms or other suitable elements) in the detection branch can be used to separate the orders for imaging spatially in a single image, as described in US2011102753A1, mentioned above. In yet other embodiments, $2^{nd}$, $3^{rd}$ and higher order beams (not shown in FIG. 3) can be used in measurements, instead of or in addition to the first order beams. In yet other embodiments, a segmented prism can be used in place of aperture stop 21, enabling both +1 and −1 orders to be captured simultaneously at spatially separate locations on image sensor 23.

Figure 3C:
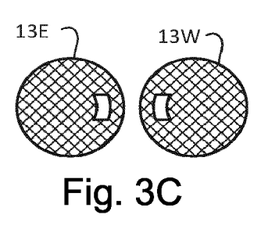
Figure 3D:
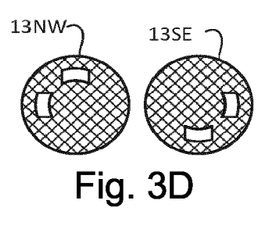

In order to make the measurement radiation adaptable to these different types of measurement, the aperture plate 13 may comprise a number of aperture patterns formed around a disc, which rotates to bring a desired pattern into place. Note that aperture plate 13N or 13S can only be used to measure gratings oriented in one direction (X or Y depending on the set-up). For measurement of an orthogonal grating, rotation of the target through 90° and 270° might be implemented. Different aperture plates are shown in FIGS. 3(c) and (d). The use of these, and numerous other variations and applications of the apparatus are described in prior published applications, mentioned above.

Figure 4:
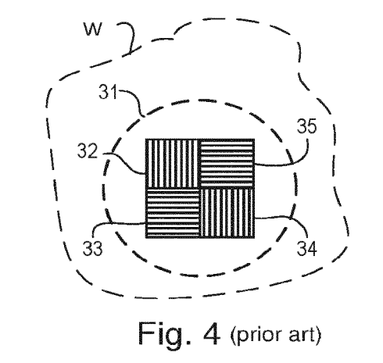
FIG. 4 depicts a known form of multiple grating target and an outline of a measurement spot on a substrate.

FIG. 4 depicts an overlay target or composite overlay target formed on a substrate according to known practice. The overlay target in this example comprises four sub-targets (e.g., gratings) 32 to 35 positioned closely together so that they will all be within a measurement spot 31 formed by the metrology radiation illumination beam of the metrology apparatus. The four sub-overlay targets thus are all simultaneously illuminated and simultaneously imaged on sensor 23. In an example dedicated to measurement of overlay, sub-targets 32 to 35 are themselves composite structures formed by overlying gratings that are patterned in different layers of the semiconductor device formed on substrate W. Sub-targets 32 to 35 may have differently biased overlay offsets in order to facilitate measurement of overlay between the layers in which the different parts of the composite sub-targets are formed. Sub-targets 32 to 35 may also differ in their orientation, as shown, so as to diffract incoming radiation in X and Y directions. In one example, sub-targets 32 and 34 are X-direction sub-targets with biases of the +d, −d, respectively. Sub-targets 33 and 35 are Y-direction sub-targets with offsets +d and −d respectively. Separate images of these sub-targets can be identified in the image captured by sensor 23. This is only one example of an overlay target. An overlay target may comprise more or fewer than 4 sub-targets.

Figure 5:
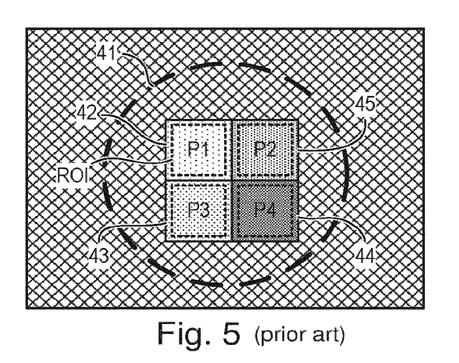
FIG. 5 depicts an image of the target of FIG. 4 obtained in the scatterometer of FIG. 3A-FIG. 3B.

FIG. 5 shows an example of an image that may be formed on and detected by the sensor 23, using the overlay target of FIG. 4 in the apparatus of FIG. 3, using the aperture plates 13NW or 13SE from FIG. 3(d). While the pupil plane image sensor 19 cannot resolve the different individual sub-targets 32 to 35, the image sensor 23 can do so. The hatched area 40 represents the field of the image on the sensor, within which the illuminated spot 31 on the substrate is imaged into a corresponding circular area 41. Within this, rectangular areas 42-45 represent the images of the small overlay target sub-targets 32 to 35. If the overlay targets are located in product areas, product features may also be visible in the periphery of this image field. Image processor and controller PU processes these images using pattern recognition to identify the separate images 42 to 45 of sub-targets 32 to 35. In this way, the images do not have to be aligned very precisely at a specific location within the sensor frame, which greatly improves throughput of the measuring apparatus as a whole.

Once the separate images of the overlay targets have been identified, the intensities of those individual images can be measured, e.g., by averaging or summing selected pixel intensity values within the identified areas. Intensities and/or other properties of the images can be compared with one another. These results can be combined to measure different parameters of the lithographic process. Overlay performance is an important example of such a parameter.

Using for example the method described in applications such as US20110027704A, mentioned above, overlay error (i.e., undesired and unintentional overlay misalignment) between the two layers within the sub-targets 32 to 35 is measured. Such a method may be referred to as micro diffraction based overlay (µDBO). This measurement may be done through overlay target asymmetry, as revealed by comparing their intensities in the +1 order and −1 order dark field images (the intensities of other corresponding higher orders can be compared, e.g. +2 and −2 orders) to obtain a measure of the intensity asymmetry.

In a known method using a multi-grating target such as that illustrated in FIG. 4, with overlay OV can be determined via the following equation:

(Equation 1)

$$OV = \frac{p}{2\pi}\tan^{-1}\left(\tan\left(\frac{2\pi d}{p}\right)\left(\frac{(I_{+d}^{+1} - I_{+d}^{-1}) + (I_{-d}^{+1} - I_{-d}^{-1})}{(I_{+d}^{+1} - I_{+d}^{-1}) - (I_{-d}^{+1} - I_{-d}^{-1})}\right)\right) \cong d\frac{A_{+d} + A_{-d}}{A_{+d} - A_{-d}}$$

where:
$I_{+d}^{+1}$ is the $+1^{st}$ diffraction order from positive bias target (e.g., intensity value);
$I_{+d}^{-1}$ is the $-1^{st}$ diffraction order from positive bias target;
$I_{-d}^{+1}$ is the $+1^{st}$ diffraction order from negative bias target;
$I_{-d}^{-1}$ is the $-1^{st}$ diffraction order from negative bias target;
$A_{+d} = I_{+d}^{+1} - I_{+d}^{-1}$; (e.g., asymmetry in the $+1^{st}$ and $-1^{st}$ intensities from positive bias target); and
$A_{-d} = I_{-d}^{+1} - I_{-d}^{-1}$, (e.g., asymmetry in the $+1^{st}$ and $-1^{st}$ intensities from negative bias target).

Equation 1 can be reformulated in terms of a sensitivity coefficient K which is a stack dependent parameter having the special property of being overlay independent (assuming a perfect target):

$$A_{+d} + A_{-d} = K \cdot OV \qquad \text{(Equation 2)}$$

where:

$$K = \frac{A_{+d} - A_{-d}}{d} \qquad \text{(Equation 3)}$$

Equation 2 is a simple linear equation, based on an assumption of small bias values and overlay errors, compared with a pitch of the gratings that form the sub-targets. However, the dependence of asymmetry on overlay error and bias over a wider range has a substantially sinusoidal form and a sinusoidal model can also be used, instead of the linear model of Equation 2.

The known method using four distinct sub-targets requires borders around each sub-target (not shown in FIGS. 4 and 5) to make them distinctive in the image 40. This means that a certain portion of the patterned area is not usable due to edge effects. Additionally, the use of only two specific offsets enforces the above assumption of linearity, which may lead to inaccuracy when the true relationship is non-linear.

The known methods of metrology of lithographic processes may be adversely affected by the metrology apparatus, for example the imperfection of the optical column may induce distortions in the image formed, distortions which may adversely affect the resulting metrology. Further, such imperfections are a specific property of a particular metrology apparatus, hence the differences between different metrology apparatuses may adversely affect the metrology process in an environment comprising multiple metrology apparatuses. More specifically, this distortion is very constant for a given combination of target, sensor and measurement profile, and therefore will not show up in the any fingerprints measured across the wafer; it will give a constant distortion offset. However, since this distortion offset is tool-dependent, it will immediately cause an unacceptably high matching issue.

Therefore it would be desirable to be able to perform metrology of a lithographic process with increased accuracy.

Disclosed herein is a target arrangement suitable for metrology of a lithographic process comprising at least one pair of similar target regions arranged centrosymmetrically. The centrosymmetric arrangement may be such that the at least one pair of similar target regions (at least for measurement in a single direction) will appear the same to the metrology apparatus when rotated through 180 degrees around a point of centrosymmetry; i.e., the two similar target regions of each pair of target regions (or at least those for measurement in a single direction) effectively swap positions. Centrosymmetry means that if the target arrangement is described by a point group plotted in x and y (parallel to the substrate plane), then every point x, y has an indistinguishable corresponding point −x, −y, with the origin defining the point of centrosymmetry.

The targets or target regions within the target arrangement may be targets suitable to measure overlay, focus, dose or physical parameters of the device structures present on the lithographic wafer, such as tilt, side wall angles, critical dimension and other dimension of interest. The targets within the target arrangement may be target suitable for Image based metrology (IBO), for diffraction based metrology (DBO) or other forms of metrology. The targets described herein may be suitable for Digital Holography Metrology. Such a target arrangement may be manifested on a substrate (e.g., as printed) or on one or more patterning devices (e.g., two patterning devices to form the two layers of the target arrangement when the parameter of interest is overlay).

The target arrangement may comprise at least a first pair of similar target regions and a second pair of similar target regions. The target regions of each pair may be similar in terms of dimensions (length and width), pitch, linewidth and line/space ratio of each of its constituent periodic structures (where it has more than one). As such, similar in this context means substantially identical in size and form (e.g., except for processing and other unintended differences/variations). In this context, a "centrosymmetric pair of target regions", or "a pair of target regions" may comprise two corresponding and similar regions which take the place of one another within the measurement spot when the substrate/wafer table is rotated through 180 degrees around a point of centrosymmetry.

In a specific example (e.g., for overlay metrology), the target arrangement may comprise a first pair of similar target regions of a first type and a second pair of target regions of a second type. In an embodiment, the target regions of both types may each comprise two constituent periodic structures (one per layer) having respectively a first pitch and a second pitch, with the order of the periodic structures being swapped between the two types; i.e., the target regions of the first type may have the structure with the first pitch in its top layer and the structure with the second pitch in its bottom layer, with the order of these structures reversed for the target regions of the second type.

In an embodiment, the target arrangement may comprise at least one pair of target regions per measurement direction (e.g. to perform metrology in two orthogonal directions). In an embodiment, the target arrangement may comprise a first and second pair of target regions (e.g., as described above) per measurement direction. The centrosymmetry of a two direction target arrangement may relate to the entire target arrangement, (i.e., there is a single point of centrosymmetry at the center of the target arrangement) or only for the target regions of a single direction (i.e., there are two points of centrosymmetry, each at the center of the target regions of a single direction).

One, some or all of the target regions may each comprise a whole target (e.g., a single target) and/or one, some or all of the target regions may comprise a portion of a larger (single) target. For example, a target arrangement which is not in itself centrosymmetric can still be used if centrosymmetric pairs of target regions (e.g., regions of interest) can be identified for the target arrangement. Also a single target may be divided into multiple target regions, i.e., it may comprise a pair of target regions, e.g., if centered on the/a point of centrosymmetry.

The presence of imperfection in the metrology apparatus manifests as a distortion in the measurements performed by said apparatus. Such distortion is a characteristic of a particular metrology apparatus, and therefore the distortion will differ when the same metrology target is measured on different metrology apparatuses. In order to make the metrology steps accurate when metrology is performed on different metrology apparatuses, it is desirable to decouple the metrology of a lithographic process from the specific contribution of each metrology apparatus. Such decoupling may be achieved by producing a transformation in the measurement of the targets, e.g., which has a known change in the measured parameter. For example, measuring said metrology parameter at a stage rotation WR0 (e.g., at a first orientation) and measuring the same parameter at a stage rotation of WR180 (e.g., at a second orientation which is 180 degrees with respect to the first orientation) induces a change in the measured overlay, by changing its sign for example, whilst the distortion based contributions remain the same. The parameter of interest may be extracted as a change in the phase between the measurements. In other words, at both orientations, essentially the same target arrangement is measured, and thus the measurements are affected by the exact same distortions from the tool. However, since the wafer was rotated between acquisitions, the overlay has changed sign. Therefore, with the measurements being essentially identical except overlay having changed sign, the overlay can be retrieved as an (e.g., phase) difference between the measurements.

This mechanism is particularly suited for metrology targets wherein the phase of measured signal is used in determining the parameter of interest of the metrology process by said metrology steps.

FIG. 6 describes various target arrangements such that such that a parameter of interest is measured while mitigating (e.g., cancelling) the specific distortions of the metrology apparatus used. The notation "Ax" describes a target of type A and suitable to measure a parameter of the lithographic process in direction x. Similarly, "Bx" describes a target of type B suitable to measure the parameter in direction x. "Ay" and "By" are notations used to describe targets of type A and B used to measure the parameter in direction y. Each pad, in the form or a rectangle or square, is a metrology target, for example a target comprising overlapping gratings, wherein the pitch of the top grating is different from the pitch of the bottom grating. In the notation of FIG. 6, type A targets have a top grating pitch smaller than the pitch of the bottom grating, and type B targets have a top grating pitch larger than the pitch of the bottom grating.

Figure 6A:
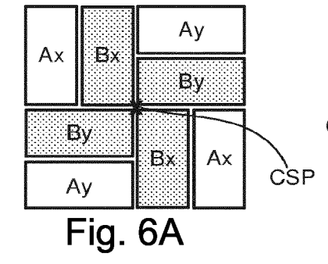
FIG. 6A-FIG. 6H depict examples of target arrangements according to embodiments of the invention.
Figure 6B:
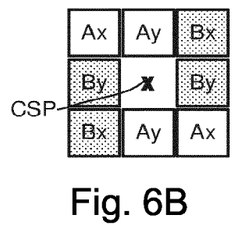
Figure 6C:
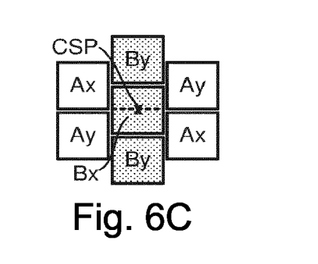
Figure 6D:
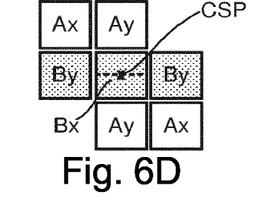
Figure 6E:
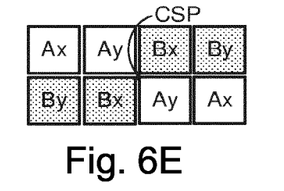
Figure 6F:
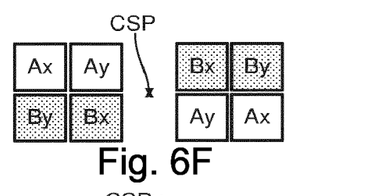
Figure 6G:
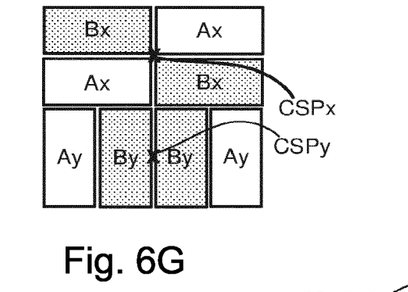
Figure 6H:
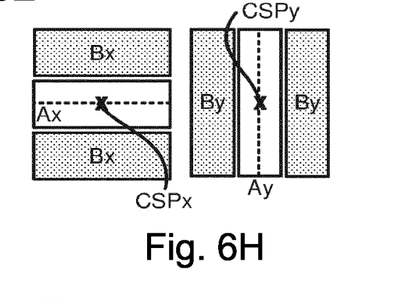

FIGS. 6(a) and 6(b) show arrangements wherein each target region is a single square or rectangular target, with the targets of both arranged around a common point of centrosymmetry. In the arrangements of FIGS. 6(c) and 6(d), two of the central target regions are formed from a single target (labelled Bx), with the point of centrosymmetry being in the center of this target so as to define a pair of target regions either side of the dotted line. Such arrangements shows that the target regions for different pairs of target regions can differ in size. FIG. 6(e) shows a rectangular target arrangement, while FIG. 6(f) shows a similar arrangement, but with the target regions divided into two groups. FIG. 6(g) shows an arrangement were the target arrangements are grouped according to measurement direction and where only these direction groups are centrosymmetric around respective points of centrosymmetry CSPx, CSPy rather than the whole target arrangement being centrosymmetric. FIG. 6(h) shows a second arrangement were the target arrangements are grouped according to measurement direction and where each groups have an odd number of targets (e.g., 3 targets) such that two of the central target regions are formed from a single target in each direction.

In all the arrangements of FIG. 6, the target arrangement as defined on the substrate has the desired centrosymmetry (albeit per direction only in the FIGS. 6(g) and 6(h) examples). However, any target arrangement suitable for metrology of a lithographic process can be used provided it comprises at least two target regions positioned within the target arrangement such that a measured property (e.g., a region of interest) of the least two target regions is centrosymmetric or has a symmetry upon rotation (through 180 degrees). It is a possibility that the target arrangements may not be arranged in the desired centrosymmetrical manner. However, provided corresponding similar centrosymmetric target regions or regions of interest (ROI) can be identified, then the decoupling of the measured parameter from the undesirable metrology tool-specific contributions can be performed.

Figure 7A:
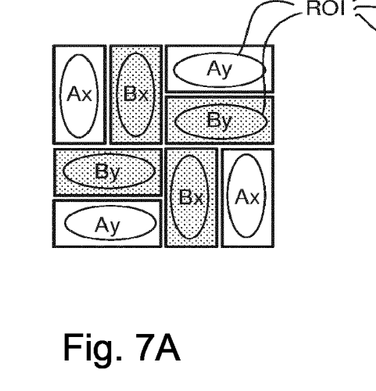
FIG. 7A-FIG. 7B depict how centrosymmetric target regions can be extracted from a non-centrosymmetric arrangement according to an embodiment of the invention.
Figure 7B:
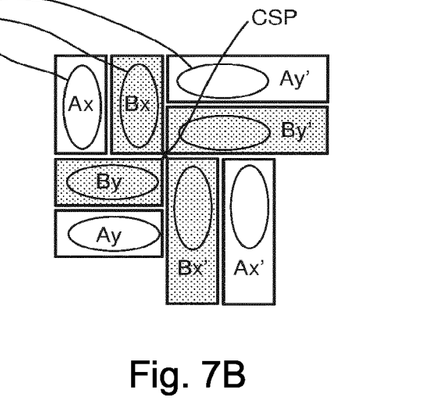

FIG. 7 illustrates such an embodiment. FIG. 7(b) is an example of a target arrangement which in itself does not have the desired centrosymmetric properties. However, by careful selection of ROIs, corresponding centrosymmetric pairs of target regions or ROIs (of the same dimensions and type) can be identified. For example, though the targets Ax and Ax' have different shapes/dimensions, they have corresponding centrosymmetric pairs of target regions which can be chosen as regions of interest ROI. In this manner, the non-centrosymmetric target arrangement of FIG. 7(b) can be measured in essentially the same way as the centrosymmetric target arrangement of FIG. 7(a)/6(a), and any target arrangement (comprising at least two targets) which enables centrosymmetric ROI placement falls within the scope of the disclosure.

A metrology method to measure a parameter of the lithography process may comprise measuring at least two target regions of a metrology target arrangement by illuminating corresponding targets with radiation, detecting the radiation scattered by the targets and determining a property in the measurement of the targets wherein the property has a symmetry upon rotation. The property of the measurement may be a Region of Interest (ROI) in a measured image of the target arrangement. The method comprises an algorithm to select ROIs such that the selected ROIs are symmetrical upon rotation through 180 degrees (i.e., centrosymmetrical).

For example, such an algorithm, may identify similar areas within an image (which may be a pupil/Fourier plane image or image plane image) of a target arrangement having substantially similar image signatures (intensity and/or phase patterns), and identify one or more pairs of target regions (at least per direction) within these similar areas, such that they have common dimensions and are centrosymmetric around a point of centrosymmetry. The point of centrosymmetry may be defined by the algorithm while determining the ROIs, or it may be a predetermined point of centrosymmetry (e.g., as labelled CSP on FIG. 7(b)).

An advantage for the method is that the measurement necessary to determine a parameter of the lithographic process are de-coupled from the nuisance contributions of the metrology apparatus and from a possible mis-arrangement of the positions of the targets within the target arrangement.

In embodiments, the pitch of each periodic structure forming the targets in the target arrangement may be resolved by optical radiation or may be not resolved by optical radiation.

There are a number of methods of measuring target arrangements as disclosed herein. In each case the targets in each direction may be measured separately or simultaneously.

Figure 8A:
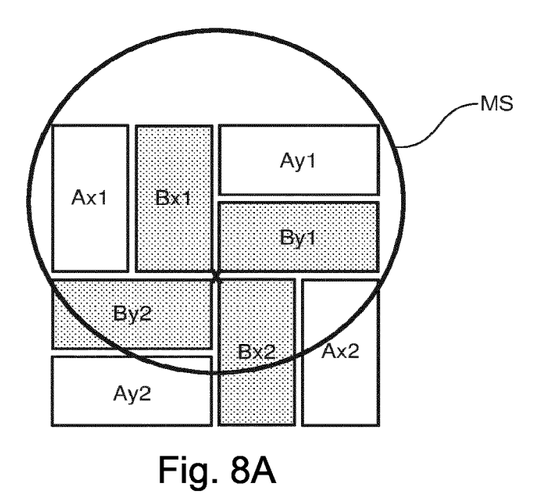
FIG. 8A-FIG. 8B illustrate two measurement configurations of a target arrangement in accordance with an embodiment of the invention.
Figure 8B:
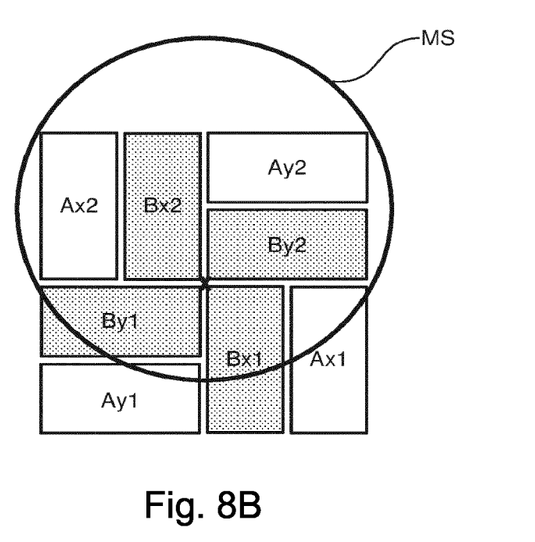

In an embodiment, illustrated in FIG. 8, only one set of target regions is measured per acquisition, where one set of target regions comprises only one target region of each pair of similar target regions. This allows the target regions to be larger, as the whole target arrangement is not required to fit within the measurement spot. FIG. 8(a) shows the target arrangement at orientation WR0 for a first acquisition and FIG. 8(b) shows the same target arrangement at WR180 for a second acquisition. Note that, in both cases, an essentially similar arrangement of target regions is captured in measurement spot MS (except that overlay will have changed direction). To better illustrate this, each target region of each pair of similar target regions is separately identified (i.e., Ax1, Ax2 for the pair of x-direction first type target regions etc.), such that it can be seen that it is the target regions labelled "1" in the measurement spot MS of FIG. 8(a) and those labelled "2" in the measurement spot MS of FIG. 8(b).

It should be noted that the reference to different orientations does not necessarily mean that the substrate/target arrangement is physically rotated. Instead the orientations are with reference to the illumination direction, and the illumination may be changed instead of rotating the substrate, e.g., by illuminating the target arrangement from a diametrically opposed direction. This can be done, for example, by using the diametrically opposite apertures 13N, 13S (or 13E, 13W) illustrated in FIG. 3(a) (or FIG. 3(d)). Similarly any mention of rotation equally refer to change of illumination direction/illumination profile. It is also known that both of these diametrically opposite aperture pairs can be used simultaneously (or other simultaneous dual direction illumination profile) with the resulting images separated optically and captured simultaneously, so the terms first acquisition and second acquisition does not necessarily suggest or imply a temporal order, these acquisitions may be simultaneous acquisitions.

In another embodiment, the entire target arrangement may be measured at both orientations. Alternatively it may be possible to measure the entire target arrangement at only a single orientation (and with a single acquisition). This is possible, for example, if there is no clear distortion gradient, i.e., no matter where the target arrangement is within the measurement spot, the distortion is the same. Such a method may comprise measuring the entire target arrangement only at the single orientation (e.g., WR0) and averaging the overlay (e.g., per direction) from the difference of overlay of one of the first type and one of the second type target regions (e.g., Ax1-Bx1 or Ay1-By1 in the diagram of FIG. 8) and the overlay of the other of the first type and the other of the second type target regions (e.g., Ax2-Bx2 or Ay2-By2 in the diagram of FIG. 8). As they will be subject to opposite distortion, which will cancel out.

In an embodiment it is proposed to measure a distortion offset for fewer than 3 target arrangements, e.g., only a single target arrangement (using any of the aforementioned methods for example), and apply this offset to all other target arrangements on the wafer. This works if the offset is very stable. This means that only one centrosymmetric target arrangement need be printed (e.g., once per field, since the reticle repeats field-to-field), and the all other target arrangements can be made smaller (e.g., half the size). Such a concept can be extended further and comprise measuring a plurality of target arrangements on the wafer at both WR0 and WR180, and training a model (e.g., a regression model or machine learning model such as a neural network) to predict the distortion offset for all other target arrangements. This could also be trained on 1 centrosymmetric target per field, leaving all other targets non-centrosymmetric. Note also that a centrosymmetry calibration could be included in the model training, improving throughput.

In an embodiment, the lines forming the top and bottom grating of each pad, e.g. Ax1 and Bx1 of FIG. 8(a) are arranged in such a manner that there at least one line of the top grating of Ax1 superposing or on top when imaged from above on a line from the bottom grating of Ax1. Such arrangement is known in prior art as "line-on-line". Due to different pitches of the top and bottom grating of each pad, a line-on-line arrangement refers, for the targets described in the embodiments throughout this invention, for a single line, or for a few pairs of lines, if the relation between the pitches and the size of the pads allow. In another embodiment, the lines of neighboring pads, for example Ax1 and Bx1 of FIG. 8(a), or By2 and Ay2, or Ay1 and By1, or Bx2 and Ax2, are shifted with respect with each by a distance given by a multiple of the pitch of the fringes formed on the image sensor divided by 8.

In an embodiment, the target layouts presented in FIGS. 6, 7 and 8 may be formed from targets described in FIGS. 4 and 5. In an embodiment, pad Ax of FIG. 6(a) may have the same pitch of the top and bottom grating and shifted with respect to each other by a bias +d and pad Bx of FIG. 6(a) may have the same pitch between the top and bottom grating shifted with respect to each other by a bias −d, where the + and − signs indicate the direction of bias ("positive" and "negative" bias as understood from FIG. 4 for example). Similar biasing may be used for the rest of the pads in the target arrangement. Such target formed in this manner is a centro-symmetric variant of the target described in FIG. 4. Such improved centro-symmetric target may be more resilient in view of illumination distortions, i.e. intensity inhomogeneities.

Illumination optics of a metrology tool may cause "even" distortions which may be detrimental in measuring accurately a value of metrology interest. A centro-symmetric layout removes such effects due to its geometry. In an embodiment, "even" distortions suppression may be achieved by sequentially re-centering each pad of the centro-symmetric variant of the target described in FIG. 4 or each pair of pads as described in FIG. 6, 7 or 8 in a 2 image acquisition steps.

In an overlay embodiment, as has been described, a target arrangement may comprise (e.g., per direction): a pair of type A targets having a grating with first pitch $p_1$ on top of grating with second pitch $p_2$ and a pair of type B targets for which these gratings are swapped such that a second pitch $p_2$ grating is on top of a first pitch $p_1$ grating. In such an embodiment, the overlay OV can be extracted from the phase differences $\Delta\varphi_{norm}$, $\Delta\varphi_{comp}$ between the type A and type B target images in respectively normal and complementary images (e.g., Fourier plane images from a +1 diffraction order and −1 diffraction order respectively) according to the following equation:

$$OV = \frac{1}{4\pi} \frac{p_1 p_2}{p_2 + p_1} \left[ \Delta\varphi_{norm} + \Delta\varphi_{comp} \right] \quad \text{Equation (4)}$$

where phase can be measured from each image as the distance between fringes of a target region (e.g., intensity fringes).

It can be appreciated that all the specific arrangements shown are purely examples and there is a near infinite number of possible target arrangements which fall within the scope of the present disclosure. For example, a target arrangement may only comprise target regions for measuring in only a single direction. Also spacing can be added between the pads to counter crosstalk and/or parallax issues. The target arrangements illustrated have been those designed for measurement of overlay. However the concepts herein are also applicable to target arrangements designed for measurement of another parameter of interest. For example, a focus arrangement (e.g., formed with regions having a focus sensitive asymmetry) can also benefit, as the focus dependent asymmetry will also change sign in the measurements and therefore be decoupled from the metrology tool-dependent distortion offsets.

In association with the physical grating structures of the targets realized on substrates and patterning devices, an embodiment may include a computer program containing one or more sequences of machine-readable instructions describing methods of measuring targets on a substrate and/or analyzing measurements to obtain information about a lithographic process. This computer program may be executed for example within unit PU in the apparatus of FIG. 3 and/or the control unit LACU of FIG. 2. There may also be provided a data storage medium (e.g., semiconductor memory, magnetic or optical disk) having such a computer program stored therein. Where an existing metrology apparatus, for example of the type shown in FIG. 3, is already in production and/or in use, the invention can be implemented by the provision of updated computer program products for causing a processor to perform the steps necessary to calculate the overlay error.

The program may optionally be arranged to control the optical system, substrate support and the like to perform the steps necessary to calculate the overlay error for measurement of asymmetry on a suitable plurality of targets.

Therefore, disclosed is a target arrangement suitable for metrology of a lithographic process comprising at least two targets positioned within the target arrangement such that the target arrangement has a symmetry upon rotation. The at least two targets may be positioned within the target arrangement such that a measured property of the at least two target has a symmetry upon rotation. Also disclosed is a method to measure a parameter of a lithographic process comprising measuring at least two targets of a metrology target arrangement by illuminating the targets with radiation and detecting the radiation scattered by the targets and determining a property in the measurement of the targets wherein the property has a symmetry upon rotation.

Further embodiments of the current invention are described in below numbered clauses:

1. A substrate comprising at least one target arrangement suitable for metrology of a lithographic process, the target arrangement comprising at least one pair of similar target regions which are arranged such that the target arrangement is, or at least the target regions for measurement in a single direction together are, centrosymmetric.

2. A substrate according to clause 1, wherein said target arrangement is such that the at least one pair of similar target regions, or at least those for measurement in a single direction, will appear the same to the metrology apparatus when rotated through 180 degrees around a point of centrosymmetry.

3. A substrate according to clause 1 or 2, wherein said at least one pair of similar target regions comprises at least a first pair of similar target regions and a second pair of similar target regions.

4. A substrate according to clause 3, wherein said first pair of similar target regions comprises target regions of a first type and said second pair of similar target regions comprises target regions of a second type.

5. A substrate according to clause 4, wherein the target regions of the first type comprise a periodic structure in a first layer having a first pitch and a periodic structure in a second layer having a second pitch and the target regions of the second type comprise a periodic structure in the first layer having the second pitch and a periodic structure in the second layer having the first pitch.

6. A substrate according to any preceding clause, wherein said at least one pair of target regions comprises at least one pair of target regions per measurement direction, for performing metrology in two orthogonal directions.

7. A substrate according to any preceding clause, wherein said target arrangement has a common point of centrosymmetry for the target regions of each measurement direction.

8. A substrate according to any preceding clause, wherein the target arrangement is centro symmetric.

9. A substrate according to any of clauses 1 to 6, wherein said target arrangement has separate points of centrosymmetry for the target regions of each measurement direction.

10. A substrate according to clause 9, wherein the target arrangement is centrosymmetric per measurement direction.

11. A substrate according to any preceding clause, wherein each of the target regions comprises a separate target structure.

12. A substrate according to any of clauses 1 to 10, wherein at least some of the target regions comprise a portion of a larger target structure.

13. A substrate according to any preceding clause, wherein the target arrangement is suitable to measure one or more of: overlay, focus, dose and physical parameters relating to device structures present on the substrate.

14. A substrate according to any preceding clause, wherein the target arrangement is suitable for image based metrology and/or for diffraction based metrology.

15. At least one patterning device comprising one or more target features configured for patterning a beam to form at least one target arrangement suitable for metrology of a lithographic process, the target arrangement comprising at least one pair of similar target regions which are arranged such that the target arrangement is, or at least the target regions for measurement in a single direction together are, centrosymmetric.

16. At least one patterning device according to clause 15, wherein said one or more target features are configured such that said target arrangement is formed such that the at least one pair of similar target regions, or at those for measurement in a single direction, will appear the same to the metrology apparatus when rotated through 180 degrees around a point of centrosymmetry.

17. At least one patterning device according to clause 15 or 16, wherein said one or more target features are configured such that said at least one pair of similar target regions comprises at least a first pair of similar target regions and a second pair of similar target regions.

18. At least one patterning device according to clause 17, wherein said one or more target features are configured such that said first pair of similar target regions comprises target regions of a first type and said second pair of similar target regions comprises target regions of a second type.

19. At least one patterning device according to clause 18, wherein:
the least one patterning device comprises a first patterning device comprising one or more target features for patterning a beam to form structures in a first layer and a second patterning device comprising one or more target features for patterning a beam to form structures in a second layer; and
the one or more target features of said first and second patterning devices are such that the target regions of the first type comprise a periodic structure in the first layer having a first pitch and a periodic structure in the second layer having a second pitch and the target regions of the second type comprise a periodic structure in the first layer having the second pitch and a periodic structure in the second layer having the first pitch.

20. At least one patterning device according to any of clauses 15 to 19, wherein said one or more target features are configured such that said at least one pair of target regions comprises at least one pair of target regions per measurement direction, for performing metrology in two orthogonal directions.

21. At least one patterning device according to any of clauses 15 to 20, wherein said one or more target features are configured such that said target arrangement has a common point of centrosymmetry for the target regions of each measurement direction.

22. At least one patterning device according to any of clauses 15 to 21, wherein said one or more target features are configured such that the target arrangement is centrosymmetric.

23. At least one patterning device according to any of clauses 15 to 20, wherein said one or more target features are configured such that said target arrangement has separate points of centrosymmetry for the target regions of each measurement direction.

24. At least one patterning device according to clause 23, wherein said one or more target features are configured such that the target arrangement is centrosymmetric per measurement direction.

25. At least one patterning device according to any of clauses 15 to 24, wherein said one or more target features are configured such to define each of the target regions as a separate target structure.

26. At least one patterning device according to any of clauses 15 to 25, wherein said one or more target features are configured such that the target arrangement is suitable to measure one or more of: overlay, focus, dose and physical parameters relating to device structures present on the at least one patterning device.

27. At least one patterning device according to any of clauses 15 to 26, wherein said one or more target features are configured such that the target arrangement is suitable for image based metrology and/or for diffraction based metrology.

28. At least one patterning device according to any of clauses 15 to 27 comprising a plurality of said target features, each target feature for forming a target arrangement or a constituent layer thereof, wherein only one or a proper subset of said plurality of target features is configured to form a target arrangement or constituent layer thereof with said at least one pair of similar target regions.

29. At least one patterning device according to clause 28, wherein the remaining target features are each configured to form a target arrangement or constituent layer thereof with only one target region of said at least one pair of similar target regions.

30. A lithographic method comprising:
obtaining at least one patterning device comprising one or more target features configured for patterning a beam to form at least one target arrangement suitable for metrology of a lithographic process, the target arrangement comprising at least one pair of similar target regions which are arranged such that the target arrangement is, or at least the target regions for measurement in a single direction together are, centrosymmetric; and
forming at least one target arrangement on a substrate using said at least one patterning device.

31. The lithographic method of clause 30 wherein said at least one patterning device comprises the least one patterning device according to any of clauses 16 to 29.

32. A metrology method comprising:
a) obtaining a substrate comprising at least one target arrangement suitable for metrology of a lithographic process, the target arrangement comprising at least one pair of similar target regions which are arranged such that the target arrangement is, or at least the target regions for measurement in a single direction together are, centrosymmetric;
b) illuminating the target arrangement with measurement illumination and capturing the resultant scattering radiation from the target arrangement; and
c) determining a value for a parameter of interest from the scattered radiation, while correcting for distortion of the metrology apparatus used to perform at least step b).

33. A metrology method according to clause 32, comprising;
performing step b) in a first acquisition with the substrate at a first orientation and a second acquisition with the substrate at a second orientation, said second orientation being 180 degrees from said first orientation with respect to the illumination direction around a point centrosymmetry of the target arrangement; and
wherein step c) comprises using measurement data from said first acquisition and said second acquisition to cancel the effect of said distortion on said parameter of interest.

34. A metrology method according to clause 33, comprising only measuring one set of target regions per acquisition, wherein one set of target regions comprises only one target region of each pair of similar target regions.

35. A metrology method according to clause 33, wherein the full target arrangement is measured at each acquisition.

36. A metrology method according to any of clauses 32 to 35, wherein said at least one pair of similar target regions comprises at least a first pair of similar target regions and a second pair of similar target regions; and
said first pair of similar target regions comprises target regions of a first type and said second pair of similar target regions comprises target regions of a second type.

37. A metrology method according to clause 36, wherein the target regions of the first type comprise a periodic structure in a first layer having a first pitch and a periodic structure in a second layer having a second pitch and the target regions of the second type comprise a periodic structure in the first layer having the second pitch and a periodic structure in the second layer having the first pitch.

38. A metrology method according to clause 36 or 37, comprising measuring the full target arrangement at only a single orientation; and wherein step c) comprises:
averaging a first difference and second difference to cancel the effect of said distortion on said parameter of interest, wherein the first difference comprises a difference of values for a parameter of interest obtained from a first one of the first pair of similar target regions and first one of the second pair of similar target regions, and the second difference comprises a difference of values for a parameter of interest obtained from a second one of the first pair of similar target regions and second one of the second pair of similar target regions.

39. A metrology method according to any of clauses 32 to 38, comprising identifying corresponding centrosymmetric similar pairs of regions of interest from images of said target arrangement obtained from the captured scattered radiation.

40. A metrology method according to clause 39, wherein said regions of interest define said target regions.

41. A metrology method according to any of clauses 32 to 40, wherein said substrate comprises a plurality of target arrangements and only a proper subset of target arrangements on said substrate comprise said at least one pair of similar target regions which are arranged to be centrosymmetric; and the method comprises:
determining a distortion offset describing said distortion from only measurements of said proper subset of target arrangements; and
correcting measurements from at least some of said plurality of target arrangements not in said proper subset with said distortion offset.

42. A metrology method according to clause 41, wherein said proper subset of target arrangements comprises fewer than three target arrangements per exposure field and said at least some of the remaining target arrangements comprises the remaining target arrangements in that exposure field.

43. A metrology method according to any of clauses 32 to 40, wherein said substrate comprises a plurality of target arrangements and only a proper subset of target arrangements on said substrate comprise said at least one pair of similar target regions which are arranged to be centrosymmetric; and the method comprises:
obtaining a trained model operable to predict a distortion offset describing said distortion; and correcting measurements from at least some of said plurality of target arrangements not in said proper subset with said distortion offset.

44. A metrology method according to clause 43, comprising an initial step of training said model by measuring said plurality of target arrangements in a first acquisition with the substrate at a first orientation and a second acquisition with the substrate at a second orientation, said second orientation comprising a 180 degree rotation.

45. A metrology method according to any of clauses 32 to 44, wherein said at least one pair of target regions comprises at least one pair of target regions per measurement direction, for performing metrology in two orthogonal directions.

46. A metrology method according to any of clauses 32 to 45, wherein said parameter of interest comprises one or more of: overlay, focus, dose and physical parameters relating to device structures present on the substrate.

47. A computer program comprising program instructions operable to cause a metrology apparatus to perform the method of any of clauses 32 to 45, when run on a suitable apparatus.

48. A non-transient computer program carrier comprising the computer program of clause 47.

49. A processing arrangement comprising:
the non-transient computer program carrier of clause 47; and
a processor operable to run said computer program.

50. A metrology apparatus comprising the processing arrangement of clause 49.

51. A lithographic apparatus comprising:
a patterning device support for supporting a patterning device;
a substrate support for supporting a substrate;
wherein the lithographic apparatus is operable to perform the method of clause 30 or 31.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), A well A particle beams, such A ion beams or electron beams.

The term "lens", where the context allows, may refer to any one or combination of various types of components, including refractive, reflective, magnetic, electromagnetic and electrostatic components.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A substrate comprising:
at least one target arrangement suitable for metrology of a lithographic process, the target arrangement comprising at least a first set of target regions configured for measurement along a first direction and a second set of target regions configured for measurement along a second direction that is different from the first direction,
wherein the first set of target regions comprises at least a first target type and a second target type, the first target type and the second target type each being configured for measurement along the first direction, and the second target type having a pitch value or an orientation that is different from that of the first target type, and
wherein, for each of the first set of target regions and the second set of target regions, the target arrangement further comprises a corresponding similar set of target regions that is positioned to be centrosymmetric, with respect to the respective first set of target regions or second set of target regions, about a point that is located within a region bounded by the target arrangement.

2. The substrate of claim 1, wherein the target arrangement is such that the first set of target regions and the second set of target regions appear identical to a metrology apparatus when rotated through 180 degrees around the point.

3. The substrate of claim 1, wherein:
the first target type comprises a periodic structure in a first layer having a first pitch and a periodic structure in a second layer having a second pitch; and
the second target type comprises a periodic structure in the first layer having the second pitch and a periodic structure in the second layer having the first pitch.

4. The substrate of claim 1, wherein the first set of target regions and the second set of target regions each comprise at least one pair of target types per measurement direction that are configured to perform metrology in two orthogonal directions.

5. The substrate of claim 4, wherein the target arrangement has a common point of centrosymmetry for the first and second target types of each measurement direction.

6. The substrate of claim 4, wherein the target arrangement has separate points of centrosymmetry for the first and second target types of each measurement direction.

7. The substrate of claim 6, wherein the target arrangement is centrosymmetric per measurement direction.

8. The substrate of claim 1, wherein the target arrangement is centrosymmetric.

9. The substrate of claim 1, wherein each of the first set of target regions and the second set of target regions each comprise a separate target structure.

10. The substrate of claim 1, wherein at least some of the first set of target regions and the second set of target regions comprise a portion of a larger target structure.

11. The substrate of claim 1, wherein the target arrangement is suitable to measure overlay, focus, dose, and/or physical parameters relating to device structures present on the substrate.

12. The substrate of claim 1, wherein the target arrangement is suitable for image based metrology and/or for diffraction based metrology.

13. The substrate of claim 1, wherein:
the first set of target regions and the second set of target regions each comprise overlapping first and second gratings having different pitches.

14. The substrate of claim 13, wherein a point of centrosymmetry is in a center of the first set of target regions and the second set of target regions.

15. The substrate of claim 1, wherein:
the at least one target arrangement comprises third and fourth adjacent targets, and the third and fourth adjacent targets are configured to be arranged in a non-centrosymmetric target arrangement and comprise different shapes or dimensions.

16. A lithographic apparatus comprising:
a projection system configured to project an image of a pattern of a patterning device onto a substrate to form at least one target arrangement suitable for metrology of a lithographic process, the target arrangement comprising at least a first set of target regions configured for measurement along a first direction and a second set of target regions configured for measurement along a second direction that is different from the first direction,
wherein the first set of target regions comprises at least a first target type and a second target type, the first target type and the second target type each being configured for measurement along the first direction, and the second target type having a pitch value or an orientation that is different from that of the first target type, and
wherein, for each of the first set of target regions and the second set of target regions, the target arrangement further comprises a corresponding similar set of target regions that is positioned to be centrosymmetric, with respect to the respective first set of target regions or second set of target regions, about a point that is located within a region bounded by the target arrangement.

17. A method comprising:
forming at least one target arrangement on a substrate using lithographic projection to project an image of a pattern of a patterning device onto the substrate, the target arrangement comprising at least a first set of target regions configured for measurement along a first direction and a second set of target regions configured for measurement along a second direction that is different from the first direction,
wherein the first set of target regions comprises at least a first target type and a second target type, the first target type and the second target type each being configured for measurement along the first direction, and the second target type having a pitch value or an orientation that is different from that of the first target type, and
wherein, for each of the first set of target regions and the second set of target regions, the target arrangement further comprises a corresponding similar set of target regions that is positioned to be centrosymmetric, with respect to the respective first set of target regions or second set of target regions, about a point that is located within a region bounded by the target arrangement.

* * * * *

UNITED STATES PATENT AND TRADEMARK OFFICE
CERTIFICATE OF CORRECTION

PATENT NO. : 12,276,921 B2
APPLICATION NO. : 17/923913
DATED : April 15, 2025
INVENTOR(S) : Zwier et al.

It is certified that error appears in the above-identified patent and that said Letters Patent is hereby corrected as shown below:

In the Specification

In Column 5, Line 23, delete "G-outer and G-inner," and replace with --σ-outer and σ-inner,--;

In Column 5, Line 53, delete "marks)" and replace with --marks).--.

In Column 10, Line 21, delete "$A_{+d}=I_{+d}^{30}$" and replace with --  --.

Signed and Sealed this
Twenty-seventh Day of May, 2025

Coke Morgan Stewart
*Acting Director of the United States Patent and Trademark Office*